United States Patent [19]
Mintz et al.

[11] Patent Number: 6,162,297
[45] Date of Patent: Dec. 19, 2000

[54] EMBOSSED SEMICONDUCTOR FABRICATION PARTS

[75] Inventors: Donald M. Mintz, Sunnyvale; Anantha Subramani, San Jose; Lolita Sharp, Los Gatos; David Datong Huo, Campbell, all of Calif.

[73] Assignee: Applied Materials, Inc., Santa Clara, Calif.

[21] Appl. No.: 08/924,205

[22] Filed: Sep. 5, 1997

[51] Int. Cl.[7] .............................. C23C 14/00; C23C 16/00
[52] U.S. Cl. ...................... 118/715; 204/298.11; 118/715
[58] Field of Search ..................... 118/715; 204/298.11, 204/298.12

[56] References Cited

U.S. PATENT DOCUMENTS

| | | | |
|---|---|---|---|
| 3,514,391 | 5/1970 | Hablanian et al. | 204/298.11 |
| 4,724,060 | 2/1988 | Sakata et al. | 204/298.12 |
| 5,064,698 | 11/1991 | Koike | 118/719 |
| 5,135,629 | 8/1992 | Sawada et al. | 204/192.12 |
| 5,614,071 | 3/1997 | Mahvan et al. | 204/298.11 |
| 5,632,869 | 5/1997 | Hurwitt et al. | 204/192.12 |
| 5,656,093 | 8/1997 | Burkhart et al. | 118/728 |
| 5,711,813 | 1/1998 | Kadoiwa et al. | 118/723 VE |
| 5,804,046 | 9/1998 | Sawada et al. | 204/298.11 |
| 5,837,057 | 11/1998 | Koyama et al. | 118/723 VE |
| 8,530,330 | 11/1998 | Lantsman | 204/192.12 |

OTHER PUBLICATIONS

New Collegiate Dictionary, G. & C. Merriam Company, p. 639, 1975.

*Primary Examiner*—Jeffrie R Lund
*Attorney, Agent, or Firm*—Thomason, Moser & Patterson

[57] ABSTRACT

A semiconductor fabrication equipment component which is exposed to a film layer fabrication environment exhibits a surface which is embossed with a pattern to provide an enhanced surface area for particle retention. The component is fabricatable using numerous embossing techniques, including knurling. The embossed surface provides the enhanced surface area without imposing a particle load on the treated part.

13 Claims, 2 Drawing Sheets

EMBOSSED SEMICONDUCTOR FABRICATION PARTS

BACKGROUND OF THE INVENTION

The present invention relates to the field of semiconductor processing equipment. More particularly, the invention relates to the materials used in semiconductor equipment useful for the fabrication of integrated circuit devices, and in particular physical characteristics or properties of such materials to enhance the quality of the thin films deposited on the substrate to form circuit pathways for the integrated circuit and the recoverability of individual devices from a substrate.

Typical semiconductor processing equipment used in the fabrication of integrated circuit devices on substrates from which individual devices are retrieved includes a vacuum environment wherein individual device are created on the substrate and film layer deposition and pattern etch steps are performed to create circuit pathways to and from the device. The film layer formation steps are typically performed using chemical vapor deposition (CVD) or physical vapor deposition (PVD) techniques, and the pattern etching typically involves the steps of resist deposition, patterning of the resist by lithography, and etching of the resist and underlying region such as a film layer in a plasma environment to form apertures therein/therethrough. In each process, any stray particles which deposit on the substrate can cause the region of the substrate on which they deposit to become defective.

One source of substrate particle contaminants in the processing equipment is from material which becomes deposited on the chamber components during the film layer deposition and etch steps. This material must be periodically cleaned from the chamber components before it becomes a nagging contaminant problem. Chamber cleaning is a time consuming process, during which substrates cannot be processed in the chamber.

Typically, to decrease the frequency at which the chamber walls must be cleaned, and thus decrease chamber downtime, the chamber components include shields which may be removed from the chamber and thereby exchangeable for clean shields after they have been contaminated with deposition material. Thus, the shields are sacrificed, but protect the chamber wall from the contaminants in the chamber. The shields may be recyclable.

Although the use of replaceable shields decreases the chamber downtime experienced during chamber cleaning, particles are still generated from the shields. The particles are primarily from two sources: extrinsic contaminants which are not removed from the chamber components prior to their placement into the chamber, and those formed by flaking off of deposition material formed on the chamber components during wafer processing. The flaking problem is often exacerbated by different coefficients of thermal expansion as between the chamber components and the contaminants. The contamination of substrates from particulate flakes from the shields, and other in chamber components, remains a substantial source of particle contamination in semiconductor fabrication equipment.

One approach to solving the problem of flaking has been to form a rough surface on the components, such as by grit blasting, thereby increasing the surface area to which a potentially contaminating material can adhere. However, it has been found that the blasting media itself, when adhered to the shield or other chamber element, can be a source of contamination once placed in the chamber and exposed to the wafer processing environment.

If a bead blasted surface is later covered with a deposition material, i.e., the surface is not a source of deposition material but merely a shield or other chamber component, the bead blasting material may not be a source of contamination. However, where the bead blasted surface is a deposition source, such as a sputtering target, the bead blasting material will likely become deposited on the substrate surface and thereby contaminate the substrate.

One solution to contamination caused by the blasting media has been to clean the blasted parts in an acid, thereby etching away any remnant blast material. However, this also reduces the surface roughness imparted to the part, thereby reducing the advantage imparted thereto by the blasting media, and also affects the tolerances on critical dimensions such as screw bores, etc.

Therefor, there exists a need in the art for a material which may be used in semiconductor fabrication equipment which includes the advantageous features of a blasted surface, without the negative, contaminating, effects of the blasting media.

SUMMARY OF THE INVENTION

The present invention provides apparatus for, and methods of, reducing particle contamination in semiconductor processing chambers. In one aspect, the invention is a semiconductor processing chamber having internal chamber components, at least a portion thereof having an embossed surface, such as that created by knurling. In another aspect, the invention is a chamber component having such an embossed surface. In a further aspect, the invention is a method of creating a chamber component. And, in a still further aspect, the invention is a method of processing a substrate including the embossed components.

DESCRIPTION OF THE EMBODIMENTS

The invention shall be described herein with reference to the appended figures, and with respect to the methods of fabrication the apparatus of the invention as well as the method of its use.

Figure 1:
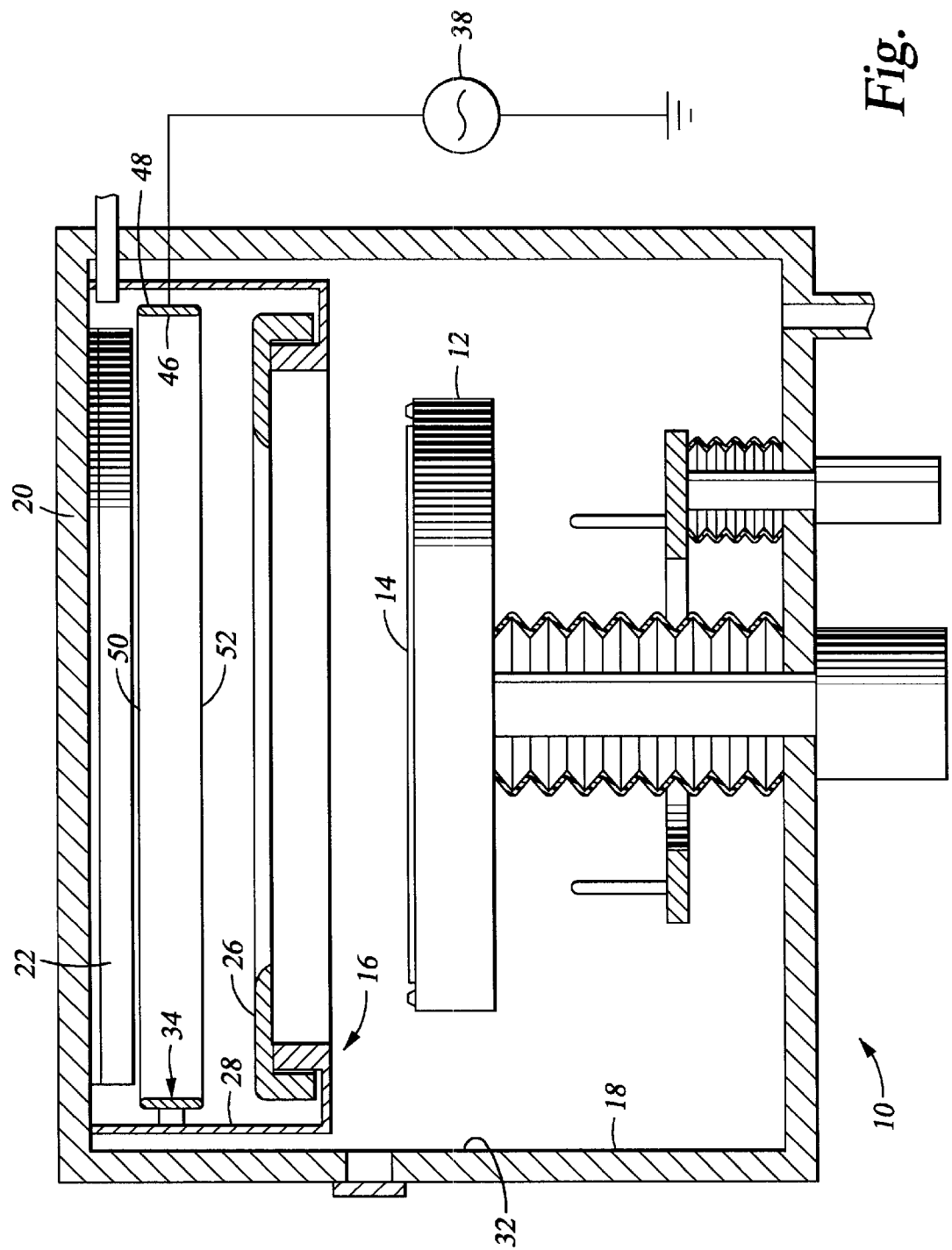
FIG. 1 is a sectional view of a illustrative semiconductor processing chamber.

Referring generally to FIG. 1, there is shown a semiconductor processing chamber 10 having a substrate support 12 on which a substrate 14 may be received and a process kit generally designated as 16 generally received within chamber body 18 and cover 20. The specific process chamber configuration shown in FIG. 1 is a sputtering chamber, wherein a target 22 is affixed to a surface of the chamber 10 such as the chamber cover 20, although the invention is equally applicable to etch and chemical vapor deposition chambers, among others where contaminating material can collect on the internal chamber components.

The process kit 16 in the specific exemplary embodiment includes a clamp ring 26 and a shield configuration 28 which, in combination, protect the internal walls 32 of the chamber 10 from the environment maintained between the target 22 and the substrate 14. In the sputtering configuration, the environment may be provided by introducing a gas into the region between the substrate 14 and target 22 at a vacuum pressure of about $10^{-1}$ to $10^{-3}$ torr, and grounding the chamber walls while subjecting the target to a bias of about −1000 volts D.C. This will strike a plasma from the gas, and attract ions from the plasma to strike the target and thereby eject target material for deposition on the substrate 14.

An additional method of forming the deposition region involves placing a antenna, such as coil 34, about the perimeter of the region between the substrate 14 and target 22, and also driving the coil 34 with an r.f. power supply 38. The power supplied to the coil 34 will inductively couple into the gas in the region between the substrate 14 and target 22, thereby striking a plasma from the gas. Then, by placing a negative D.C. bias on the target 22, the ions in the gas strike the target 22 and eject target atoms therefrom for deposition on the substrate 14. Preferably, the coil 34 is placed within the circumference of the shield 28, which will enable the coil 34 to continue to couple energy into the plasma when the shield 28 is fully covered with a conductive deposition material.

Although the desired deposition location for the material sputtered from the target 22 is the substrate 14, the material also deposits on all of the surfaces exposed to the plasma, including the shields 28, the clamp ring 26 and coil 34. Material flaking from any of these sources is a potential substrate contaminant.

Figure 2:
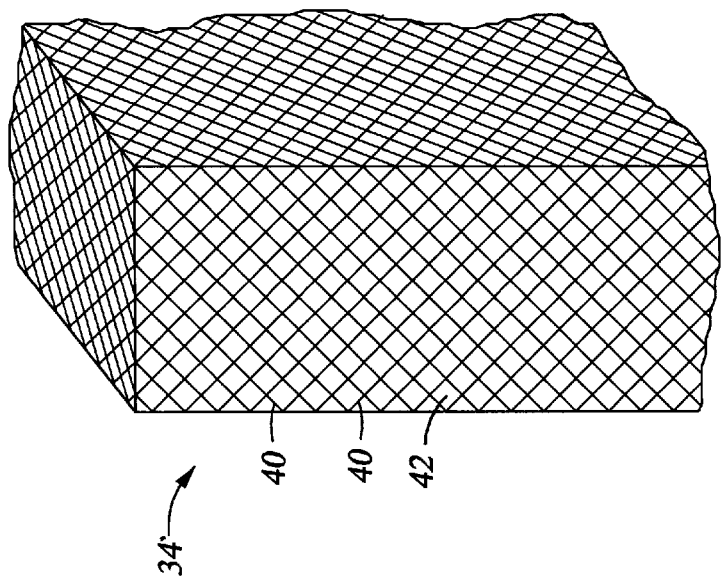
FIG. 2 is a partial perspective view of a chamber component of the chamber of FIG. 1, showing an embossed pattern on the chamber component.

Referring now to FIG. 2, there is shown an enlarged view of the surface of coil 34, showing the inventive embossed pattern 40 on the coil 34 surface. The pattern in this embodiment is preferably comprised of a plurality of protrusions 40, separated by lands 42. The formation of the protrusions 40 and lands 42 on the part is preferably accomplished by knurling, although other machining processes may be used to accomplish the embossing.

Figure 3:
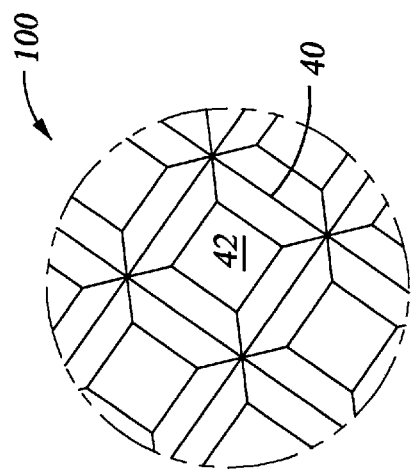
FIG. 3 is an exploded view of a knurling tool.
Figure 4:
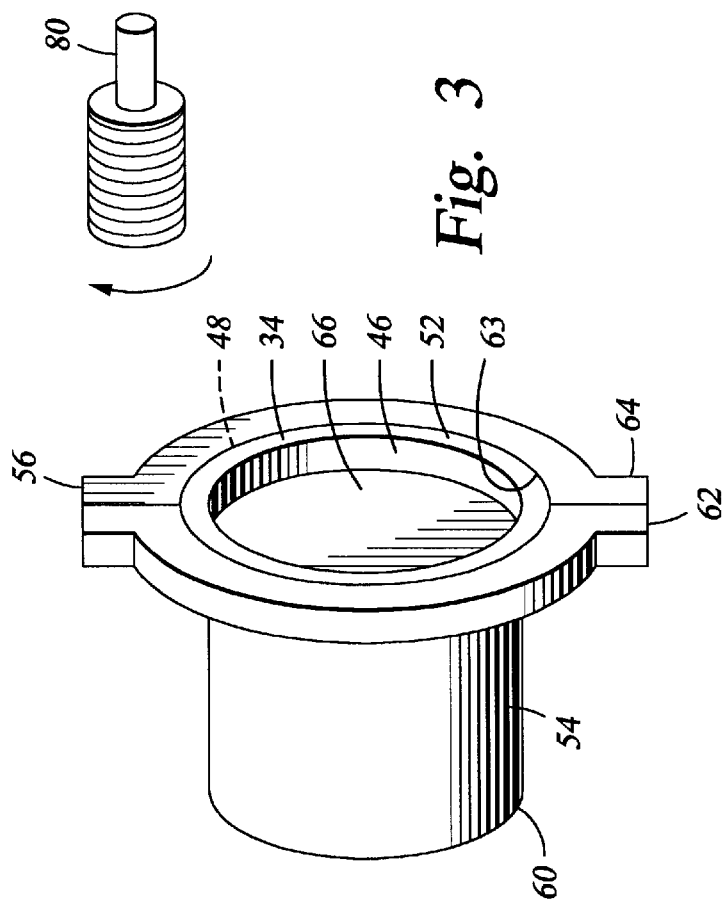
FIG. 4 is a schematic view of tooling used to emboss the pattern in the semiconductor chamber part.

Referring now to FIGS. 3 and 4, an apparatus for holding the coil 34 for knurling, and a schematic illustration of the knurling operation, are shown. Preferably, although not necessarily, the process kit components are comprised of, or covered with, the same material as that which will be deposited in the chamber in which they are to be used. Additionally, in the case of the coil 34, it may be a hollow or solid section of material having a height of approximately 1 to 20 cm and a thickness substantially less than its height, and a length (when configured in a circle) which exceeds the circumference of the plasma generation region of the chamber to enable the coil to surround the plasma generation region to generate the plasma. Preferably, the embossing is performed on the coil after the coil has been shaped to its configuration in use, i.e., it is formed into a circle having one or more turns, and exhibits inner surface 46, outer surface 48 and sides 50, 52 (48 and 50 shown in FIG. 1).

To emboss the coil surfaces 46–52 of a formed coil, a knurling fixture has a cylindrical mount 54, over which the coil 34 is supported, and a yoke 56 disposed over the coil 34 to secure the coil 34 to the mount 54. The outer circumference 60 of the mount 54 is equal to, or slightly less than, the inner circumference of the coil 34, and the inner circumference 63 of the yoke 56 is equal to, or slightly smaller than, the outer circumference of the coil 34. Thus, the coil 34 may be slipped over the mount 54, and the yoke 56 positioned thereover to secure the coil 34 for machining. Preferably, the yoke 56 includes two yoke halves 62, 64, each having a central bore 66 which, when the yoke halves 62, 64 are joined over the coil 34, provide the inner diameter 63 of the yoke 56. The yoke halves 62, 64 may be joined by extending bolts through bores in one half and securing them into threaded holes in the other half, or other mechanisms such as clamps, screws, wrappings or the like.

The fixture is then mountable to a moveable vise attached to the bed of a lathe having a knurling tool 80 mounted to the spindle thereof, such that the surfaces of the coil 34 may be contacted with the knurling tool. The knurling tool, the fixture, or both may orbit to enable the knurling tool to follow the surface of the coil and provide the embossing. To emboss the inner surface 48 of the coil 34, the coil is extended laterally over the end of the mount, such that the knurling tool is located inside the coil 34 to contact the inner surface 48. By configuring the tool to impart 100 to 150 lines of embossment per inch, the resulting surface finish on the part being knurled or embossed in the range of 200 to 500 microinch. Thus, a surface finish having the particle adhering and particle trapping properties of the prior art is attainable, without leaving grit residue on the part.

Additionally, in most components, it will be significantly easier to apply the knurled surface prior to configuring the part in its final or near final shape. For example, the coil 34 is typically formed from a metal strip, which may be hollow to accommodate cooling channels therein. This material can easily be embossed, such as by passing it under a knurling tool as previously described, or, by feeding the stock under rollers having an embossing pattern therein.

An additional means of applying a suitable embossed pattern in the coil 34 or other chamber component is provided by embossing a pattern into the component surface with a vibrating tool to "peen" the surface, such as with a vibrating engraving tool sold by Burgess Vibrocrafters under the designation "Electro Engraver Model No. V-30/V-40. The tool for providing this embossment preferably has a shank which is driven to vibrate at a relatively high frequency, thereby causing the tip or end of the shank to repeatedly strike the surface to be textured in such a way as to form a random pattern of indentations in the component surface. The tool may be held in the hand, or mounted in a jig or fixture to enable the shank tip to be scanned over the component surface.

Referring now to FIG. 4, one knurling pattern 100 is shown for embossing the knurled pattern on the chamber component. The pattern 100 includes a series of raised ridges 40 surrounding lands 42. In the embodiment of the invention shown in FIG. 4, the ridges 40 are disposed perpendicularly to each other, thereby providing generally rectangular lands 42. When the knurling tool surface having the ridges 40 and lands 42 is rolled over a component with a force directed perpendicular to the point or line of contact between the tool 80 and chamber component, a negative pattern is embossed or impressed into the component. The ridges 40 emboss depressions into the component, and the extruded or yielded material of the component may form find clearance space at the land 42 area. Alternatively, the tool 80 may have a reverse surface, wherein the land area extends from the tool surface, and the ridges are changed to recessed grooves. Using this embodiment, a series of dimples are impressed into the component. Additionally, the knurling tool may make multiple passes over the component surface, at the same or different angle with respect to the component, to produce even finer depressions and ridges on the component.

After embossing is completed, the part is cleaned using a water detergent solution to remove any machining or other residue oils, and then lightly etched in an acid, such as a mixture of nitric and hydrofluoric acids having a Ph of approximately 0, followed by a second etch in a bath of 35% hydrochloric acid. This will remove any residual free material left behind by the vibrating tool or knurling tool, and soften any sharp edges, without significantly reducing the enhanced surface area provided by the inventive methods.

Although the embossing has been described herein as a specific knurling configurations, other knurled configurations, and other embossing techniques, such as compressive impression of a pattern into the part, configuration of parts from pre-embossed panels or sheets of material, or other methods of mechanically imparting fine protrusions on a part, i.e., without processes such as grit blasting, are specifically contemplated herein. Additionally, other chamber parts, including sputter targets, backing plates, etc., may also benefit from this treatment.

We claim:

1. A processing system comprising a chamber, a target disposed in the chamber and a conductive coal comprising a patterned surface, wherein the patterned surface provides a sputtering surface in a process environment defined by the chamber.

2. The processing system of claim 1, wherein the patterned surface is knurled.

3. The processing system of claim 1, wherein the patterned surface is random.

4. The processing system of claim 1, wherein the conductive coil comprises a deposition material for a process environment defined by the chamber.

5. The processing system of claim 1, wherein the patterned surface is peened.

6. The processing system of claim 1, wherein the conductive coil is made of metal.

7. The processing system of claim 1, further comprising a backing plate, wherein the target is mounted to the backing plate.

8. The processing system of claim 1, further comprising a power source coupled to the conductive coil.

9. The processing system of claim 1, wherein the conductive coil is made from a unitary piece of material.

10. A conductive coil comprising a monolithic body having a patterned surface and adapted to provide a sputtering surface in a processing chamber.

11. The conductive coil of claim 10, wherein the patterned surface is knurled.

12. The conductive coil of claim 10, wherein the patterned surface is peened.

13. The conductive coil of claim 10, wherein the conductive coil is made from an unitary piece of material.

* * * * *

UNITED STATES PATENT AND TRADEMARK OFFICE
CERTIFICATE OF CORRECTION

PATENT NO : 6,162,297

DATED : December 19, 2000

INVENTOR(S): Mintz et al.

It is certified that error appears in the above-identified patent and that said Letters Patent are hereby corrected as shown below:

On page one, references cited section, please replace " 8,530,330" with " 5,830,330" .

Signed and Sealed this

First Day of May, 2001

NICHOLAS P. GODICI

Attest:

Attesting Officer

Acting Director of the United States Patent and Trademark Office